US008082978B2

(12) United States Patent
Fedorov

(10) Patent No.: US 8,082,978 B2
(45) Date of Patent: Dec. 27, 2011

(54) FLUID-TO-FLUID SPOT-TO-SPREADER HEAT MANAGEMENT DEVICES AND SYSTEMS AND METHODS OF MANAGING HEAT

(75) Inventor: Andrei G. Fedorov, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1103 days.

(21) Appl. No.: 11/874,971

(22) Filed: Oct. 19, 2007

(65) Prior Publication Data

US 2009/0040716 A1 Feb. 12, 2009

Related U.S. Application Data

(60) Provisional application No. 60/954,380, filed on Aug. 7, 2007.

(51) Int. Cl.
*F28F 19/02* (2006.01)
*H05K 7/20* (2006.01)
(52) U.S. Cl. ........................... 165/133; 165/80.4
(58) Field of Classification Search .......... 165/80.4, 165/80.3, 104.21, 108, 908, 104.33; 361/699, 361/700; 257/714, 715
See application file for complete search history.

(56) References Cited

U.S. PATENT DOCUMENTS

| | | | |
|---|---|---|---|
| 5,000,252 A | 3/1991 | Faghri | 165/10 |
| 5,361,188 A * | 11/1994 | Kondou et al. | 361/695 |
| 5,412,536 A * | 5/1995 | Anderson et al. | 361/700 |
| 5,661,637 A | 8/1997 | Villaume | 361/687 |
| 5,737,187 A | 4/1998 | Nguyen et al. | 361/704 |
| 5,930,155 A | 7/1999 | Tracy et al. | 361/704 |
| 6,058,012 A | 5/2000 | Cooper et al. | 361/704 |
| 6,061,235 A | 5/2000 | Cromwell et al. | 361/690 |
| 6,122,181 A | 9/2000 | Akram et al. | 361/704 |
| 6,239,972 B1 | 5/2001 | Tehan et al. | 361/704 |
| 6,482,520 B1 | 11/2002 | Tzeng | 428/408 |
| 6,550,263 B2 * | 4/2003 | Patel et al. | 62/259.2 |
| 6,727,422 B2 | 4/2004 | Macris | 136/201 |
| 6,775,140 B2 | 8/2004 | Shim et al. | 361/704 |
| 6,882,535 B2 | 4/2005 | Labanok et al. | 361/704 |
| 6,924,027 B2 | 8/2005 | Matayabas, Jr. et al. | 428/323 |
| 7,013,955 B2 | 3/2006 | Phillips et al. | 165/104.21 |
| 7,061,104 B2 | 6/2006 | Kenny, Jr. et al. | 257/714 |
| 7,100,681 B1 | 9/2006 | Wu et al. | 165/104.33 |
| 7,212,403 B2 | 5/2007 | Rockenfeller | 361/687 |
| 7,301,770 B2 * | 11/2007 | Campbell et al. | 361/699 |
| 7,303,005 B2 | 12/2007 | Reis et al. | 165/185 |
| 7,316,265 B2 * | 1/2008 | Searls et al. | 165/104.33 |
| 7,787,248 B2 * | 8/2010 | Campbell et al. | 361/700 |
| 7,819,175 B2 * | 10/2010 | Zoodsma | 165/104.33 |
| 2006/0126296 A1* | 6/2006 | Campbell et al. | 361/700 |
| 2006/0262363 A1* | 11/2006 | Henley | 358/516 |
| 2007/0121294 A1* | 5/2007 | Campbell et al. | 361/699 |
| 2007/0153480 A1* | 7/2007 | Zhang et al. | 361/700 |

* cited by examiner

*Primary Examiner* — Tho V Duong

(74) *Attorney, Agent, or Firm* — Thomas, Kayden, Horstemeyer & Risley, LLP

(57) ABSTRACT

Briefly described, embodiments of this disclosure include heat management devices, heat management systems, methods of heat management, and the like.

21 Claims, 4 Drawing Sheets

FLUID-TO-FLUID SPOT-TO-SPREADER HEAT MANAGEMENT DEVICES AND SYSTEMS AND METHODS OF MANAGING HEAT

CROSS-REFERENCE TO RELATED APPLICATION

This application claims priority to U.S. provisional application entitled, "FLUID-TO-FLUID SPOT-TO-SPREADER HEAT SINK," having Ser. No. 60/954,380, filed on Aug. 7, 2007, which is entirely incorporated herein by reference.

BACKGROUND

For many applications, heat is transferred or dissipated to the ambient through conduction and air convection. In order to increase the power of a system, it is necessary to increase the heat dissipation capabilities of the system. Because the convection heat transfer coefficient is commonly the system limitation, extending the heat transfer area can increase the rate of heat dissipation. An example of this is a radiator. Connecting the radiator to a system heat source can increase the heat transfer area through which heat can be rejected to the ambient. As the radiator size (i.e., surface area) increases, its capability to dissipate heat increases allowing the accommodation of larger system power loads.

The current trend is to design electronic systems to provide more powerful systems in smaller package sizes. In contrast to the previous discussion, this trend signifies increased heat loads and dissipation needs while decreasing the package size and thus the package area available for heat dissipation. Consequently, improving the heat transfer from the heat source of a system to the ambient becomes a significant consideration for this kind of application. In particular, high performance microprocessors, especially power-limited chips, dissipate very significant power, leading to significant average heat fluxes over the entire chip area (~70-100 W/cm$^2$) as well as ultra high local heat fluxes at the location of hot spots (~200-500 W/cm$^2$).

BRIEF DESCRIPTION OF THE DRAWINGS

Many aspects of this disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

SUMMARY

Figure 1A:
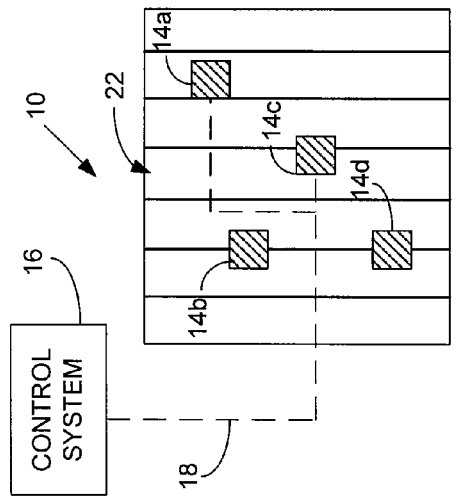
FIG. 1A illustrates a top view of a heat generating structure having four hot spots.

Briefly described, embodiments of this disclosure include heat management devices, heat management systems, methods of heat management, and the like. One exemplary heat management device, among others, includes: a global heat dissipater structure disposed on a portion of a heat generating structure, wherein the heat from the heat generating structure heats the global heat dissipater structure, and wherein the global heat dissipater structure includes global heat dissipater conduits; a first fluid directed to circulate in the global heat dissipater conduit to dissipate heat from the heat generating structure; a local heat dissipater structure disposed in thermal communication with the global heat dissipater and with at least one hot spot of the heat generating structure, wherein the local heat dissipater structure includes local heat dissipater conduits that are adjacent at least one hot spot and the global heat dissipater conduits; and a second fluid directed to circulate in the local heat dissipater conduit to dissipate heat from at least one hot spot, wherein the heat of the second fluid is dissipated to the first fluid in the global heat dissipater conduits, and wherein the first fluid and the second fluid are not mixed with one another.

One exemplary heat management system, among others, includes: a heat generating structure that includes at least one hot spot; a global heat dissipater structure disposed on a portion of the heat generating structure, wherein the heat from the heat generating structure heats the global heat dissipater structure, and wherein the global heat dissipater structure includes global heat dissipater conduits; a first fluid directed to circulate in the global heat dissipater conduit to dissipate heat from the heat generating structure; a first fluid pump to circulate the first fluid through the global heat dissipater conduit; a local heat dissipater structure disposed in thermal communication with the global heat dissipater and with at least one hot spot of the heat generating structure, wherein the local heat dissipater structure includes local heat dissipater conduits that are adjacent at least one hot spot and the global heat dissipater conduits; a second fluid directed to circulate in the local heat dissipater conduit to dissipate heat from at least one hot spot, wherein the heat of the second fluid is dissipated to the first fluid in the global heat dissipater conduits, and wherein the first fluid and the second fluid are not mixed with one another; and a second fluid pump to circulate the second fluid through the local heat dissipater conduit.

One exemplary method of dissipating heat in a heat generating structure, among others, includes: circulating a first fluid adjacent a portion of the heat generating structure; dissipating heat from a portion of the heat generating structure to the first fluid; circulating a second fluid adjacent at least one hot spot on the heat generating structure; dissipating heat from at least one hot spot on the heat generating structure to the second fluid; and circulating the second fluid adjacent the first fluid to dissipate heat from the second fluid to the first fluid.

DETAILED DESCRIPTION

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of physics, thermodynamics, heat transfer, chemistry, material science, and the like, which are within the skill of the art. Such techniques are explained fully in the literature.

The following examples are put forth so as to provide those of ordinary skill in the art with a complete disclosure and description of how to perform the methods and use the compositions and compounds disclosed and claimed herein. Efforts have been made to ensure accuracy with respect to numbers (e.g., amounts, temperature, etc.), but some errors and deviations should be accounted for. Unless indicated otherwise, parts are parts by weight, temperature is in ° C., and pressure is in atmosphere. Standard temperature and pressure are defined as 25° C. and 1 atmosphere.

Before the embodiments of the present disclosure are described in detail, it is to be understood that, unless otherwise indicated, the present disclosure is not limited to particular materials, reagents, reaction materials, manufacturing processes, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

DISCUSSION

Heat management devices (also referred to as a hybrid Fluid-to-Fluid Spot-to-Spreader ($F^2/S^2$) heat sink), systems, and methods of heat management, are disclosed. Embodiments of the present disclosure provide for thermal management schemes that seamlessly integrate cooling approaches on the global (chip-level) and local (hot spot-level) scales, which complement or even enhance each other's performance via appropriate thermal load matching and highly integrated design.

Embodiments of the present disclosure provide for an innovative heat sink (heat management devices and systems) design aimed at meeting both the hot spot and large background heat flux requirements for heat generating structures such as next generation integrated circuits and computer chips. The heat management devices and systems are designed to utilize two separate, unmixed fluids to meet the cooling requirements of the heat generating structure with one fluid (the second fluid) acting as a fluidic spreader dedicated to cooling the hot spots, while another fluid (the first fluid) serves as both a coolant for the background heat fluxes as well as a regenerator for the hot spot fluid (the second fluid).

Embodiments of the present disclosure provide a heat sink design that, through close coupling of the two fluids, can theoretically remove hot spot heat fluxes on the order of 1 $kW/cm^2$ from one or multiple hot spots and background heat fluxes greater than 100 $W/cm^2$ in one compact and efficient package. In addition, embodiments of the present disclosure can handle the thermal loads with a relatively small pressure drop penalty, capable of being handled by existing micropump technologies.

Embodiments of the heat management device or system include a heat generating structure, a global heat dissipater structure, a first fluid, a local heat dissipater structure, and a second fluid. The global heat dissipater structure functions to remove heat from the entire or substantially the entire area of the heat generating structure using the first fluid. In an embodiment, the global heat dissipater structure functions to remove heat at the chip level. The local heat dissipater structure functions to remove heat from the hot spots of the heat generating structure using the second fluid. In an embodiment, the local heat dissipater structure functions to remove heat at the hot spots of the chip at the localized level. The local heat dissipater structure functions to remove heat from the hot spots using the second fluid, which then dissipates heat to the first fluid in the global heat dissipater. The first fluid functions to dissipate the heat from the second fluid as well as the remaining area of the heat generating structure. The first fluid and the second fluid are not mixed, but are thermally coupled via thermal communication (e.g., exchange heat) between the local heat dissipater structure and the global heat dissipater structure.

Embodiments of the present disclosure are advantageous for at least the following reasons: (1) efficient matching of spatially-distributed areas of high and low heat flux cooling structures within a heat management device or system (i.e., a monolithic fluidic package) with internal coolant (second fluid) regeneration, (2) low total pumping power input required for operating heat management device or system operation, (3) nearly isothermal heat generating structure (e.g., chip) surface even in the presence of significant hot spots, (4) capability for addressable on-demand cooling of one or more hot spots on the heat generating structure (e.g., chip), which can be dynamically reconfigured as the heat dissipation profile (location and heat flux magnitude of hot spots) changes in the course of operation, (5) high degree of integration and device/system compactness, and (6) simplicity of design and packaging, as well as modularity of design of the heat management device or system.

The heat generating structure can be a structure such as, but not limited to, a computer chip, an electronic component, a display, an engine, a fuel cell or other power generation device (e.g., solar cell), a chemical reactor, a light source, and the like. The heat generating structure includes areas of heat fluxes over the entire structure area (e.g., ~30-100 W/cm$^2$ in a computer chip) as well as ultra high local heat fluxes at the location of hot spots (e.g., ~200-500 W/cm$^2$ in a computer chip). The heat generating structure can include one or more hot spots. The hot spots can be independently monitored to determine when the hot spots are at elevated temperatures and require cooling. In addition, the locations of hot spots can be determined prior to use, so that the heat management device or system can be properly designed.

The global heat dissipater structure is disposed (e.g., directly (in direct contact) or indirectly (in indirect contact (e.g. an interface structure disposed between the structures))) on a portion or over the entirety of the heat generating structure. In an embodiment, the global heat dissipater can be a global heat sink for a heat generating structure such as a computer chip. The global heat dissipater structure may include global heat dissipater fluid conduits of various number and shape, such as a single slit or multiple micro or mini channels, as well as fins, pin-fin arrays, or other extended surfaces commonly used for heat transfer enhancement.

The global heat dissipater conduits or fins can have a height of about 100 μm to 10 cm, width of about 10 μm to 1 cm, and a length of about 5 mm to 100 cm.

The global heat dissipater can be made of solid or porous materials (preferably with high thermal conductivity) such as, but not limited to, copper, aluminum, silicon, diamond, steel, carbon, different polymers, or composite materials, and combinations thereof.

It should be noted that two or more layers of global heat dissipaters could be used to enhance heat dissipation and spreading capabilities. In addition, two or more layers of global heat dissipaters can be used to dissipate heat in vertically integrated packages such as three-dimensional computer die stacks.

The heat from the heat generating structure heats (e.g., directly (in direct contact) or indirectly (in indirect contact via thermal interface material) the global heat dissipater structure. A first fluid is directed to circulate in the global heat dissipater conduits to dissipate heat from the heat generating structure. In other words, the heat from the heat generating structure is thermally communicated to the first fluid via contact with the global heat dissipater structure.

The local heat dissipater structure is disposed on the global heat dissipater and on at least one hot spot of the heat generating structure. The local heat dissipater structure includes local heat dissipater fluid conduits that are adjacent the global heat dissipater fluid conduits. In addition, the local heat dissipater structure includes local heat dissipater fluid conduits that are adjacent at least one hot spot. The conduits of the local heat dissipater structures adjacent to the global heat dissipater and to the hot spot can be of the same size and shape or of different size and shape. The fluid flow of the local heat dissipater conduits and the global heat dissipater conduits are structurally separated from each other, but can interact (i.e., exchange heat) thermally.

The local heat dissipater conduit adjacent to the global heat dissipater can be a single planar slit or one or multiple channels with or without additional extended surfaces such as fins and fin arrays. In general, the local heat dissipater conduits adjacent to the global heat dissipater can have a height of about 100 μm to 10 cm, width of about 10 μm to 1 cm, and a length of about 5 mm to 100 cm.

The local heat dissipater fluid conduits adjacent to the hot spot and the global heat dissipater are in fluidic communication via a conduit designed to minimize the pressure drop (pumping power) needed to transport the second fluid from the location of the hot spot(s), where it accepts heat, to the location on the global heat dissipater where it rejects heat to the first fluid, and thus being regenerated. However, the dimensions of the local heat dissipater conduits may change at positions adjacent the hot spots and among different hot spots.

In an embodiment, the local heat dissipater conduit adjacent to the hot spots can be a constriction or a nozzle directed towards the hot spot, or porous plug or a single or multiple cavities (e.g., a microchannel) with or without additional extended surfaces such as fins and fin arrays. In general, the local heat dissipater conduits adjacent to the hot spot can have a height of about 100 nm to 100 μm, width of about 100 nm to 1 mm, and a length of about 100 nm to 1 mm. The specific dimension of the local heat dissipater adjacent the hot spot depend in part on the type and design of the local heat dissipater.

The ratio of cross-section of the local heat dissipater conduit and the first constricted cavity is about 1 to 10,000.

The local heat dissipater can be made of materials (preferably with high thermal conductivity) such as, but not limited to, copper, aluminum, silicon, diamond, steel, carbon, different polymers, or composite materials, and combinations thereof.

It should be noted that two or more layers of local heat dissipaters could be used to enhance heat dissipation and spreading capabilities. In addition, two or more layers of local heat dissipaters can be used to dissipate heat in vertically integrated packages such as three-dimensional computer die stacks.

Embodiments of the heat management device or system can include, but are not limited to, connecting pipes, valves, fluid pumps (e.g., one or more second fluid (liquid) pumps or one or more first fluid (e.g., air) fans), temperature sensors, flow rate and pressure sensors or meters, heat flux sensors, and interface/packaging materials.

It should also be noted that combinations of two or more global heat dissipaters and/or two or more local heat dissipaters could be used to enhance heat dissipation and spreading capabilities.

For example, in an embodiment, the heat management device or system, includes the heat generating structure, the global heat dissipater structure, the first fluid, the local heat dissipater structure, and the second fluid, as mentioned above, as well as a second global heat dissipater structure, a third fluid (similar to or the same as the first fluid), a second local heat dissipater structure, and a fourth fluid (similar to or the same as the second fluid). The structure of the second global heat dissipater structure and the second local heat dissipater structure are similar to the global heat dissipater structure and the local heat dissipater structure described above.

In an embodiment, the second global heat dissipater structure and the second local heat dissipater structure can be disposed adjacent the global heat dissipater structure and the local heat dissipater structure on the heat generating structure.

In another embodiment, the second global heat dissipater structure and the second local heat dissipater structure can be disposed on top of (stacked) a portion of the global heat dissipater structure and a portion of the local heat dissipater structure on the heat generating structure.

The first and third fluids could flow independent of one another or could be mixed. The second fluid and the fourth fluid could flow independent of one another or could be mixed after interaction with their respective hot spots. The second fluid and the fourth fluid could dissipate heat to one of the first fluid and second fluid, or the second fluid and the fourth fluid could dissipate heat to either or both of the first fluid and second fluid. The design of the conduits of each of the heat dissipaters can vary depending on the heat generating structure. In this regard, heat dissipation among the fluids depends upon the design and configuration of the conduits.

As used herein, the term "adjacent" refers to the relative position of one or more features or structure, where such relative position can refer to being near or adjoining. Adjacent structures can be spaced apart from one another or can be in actual contact with one another. In some instances, adjacent structures can be coupled to one another or can be formed integrally with one another.

In an embodiment, the local heat dissipater conduit includes a first constricted cavity in a location of the local heat dissipater conduit that is adjacent a first hot spot. The local heat dissipater conduit is configured to flow the second fluid through the first constricted cavity to dissipate heat at the hot spot via forced convection with or without phase change (e.g., boiling or thin film evaporation). The constricted cavity functions to decrease the hydraulic diameter of the local heat dissipater fluid conduit and thus to increase the convective heat transfer coefficient enabling the second fluid to dissipate the high heat fluxes produced at the hot spots. The velocity of the second fluid in the constricted cavity can be about 50-200 m/s for the second fluid in the gas phase (e.g., air) and about 10-50 m/s for the second fluid in the liquid phase (e.g., water).

In an embodiment, the local heat dissipater conduit includes a first jet-structure configured to produce one or multiple microjets of the second fluid that impinges upon a first hot spot to dissipate heat at the hot spot. The microjet could be homogeneous and submerged or a gas jet carrying droplets of the second fluid toward the hot spot. The local heat dissipater conduit is configured to direct the second fluid flow through the local heat dissipater channel adjacent to the global heat dissipater after impinging upon the hot spot. The dimensions of the jet-structure can have a hydraulic diameter of about 100 nm to 1 mm and jet velocities of about 50 to 200 m/s for the second fluid in the gas phase (e.g., air) and about 10 to 50 m/s for the second fluid in the liquid phase (e.g., water). The function of the jet-structure is to utilize very high convective heat transfer coefficient of the impinging flow, with or without phase change (i.e., the second fluid evaporation), to dissipate very high heat fluxes at the hot spot.

The first fluid may be a conductive or dielectric liquid (e.g., water or liquid refrigerant or fluorocarbon such FC-72) or a gas (e.g., air) or a suspension of nanoparticles (e.g., chemically stable nanoparticles made of metals, metal oxides, and/ or carbon in various forms, commonly known as the "nanofluids"). The main function of the first fluid is to dissipate the average (e.g., chip-level) heat load of the heat generating structure. In an embodiment having a lower power dissipation (e.g., 15-50 W/cm$^2$), the first fluid can be air. In an embodiment having a power dissipation that is sufficiently large (e.g., >50 W/cm$^2$), the first fluid can be a liquid. The first fluid can be a liquid such as, but not limited to, water, a fluorocarbon (e.g., FC-72), and a refrigerant (e.g., liquid $CO_2$, R134a, and the like).

Another function of the first fluid is to remove heat from the second fluid using an intimate thermal contact (able to thermally communicate) between the fluid streams. A large contact area between the two fluid streams and fairly small total amount of heat (because of the very small size of hot spots even despite high local heat fluxes) carried by the second fluid from one or more hot spots allows for quick and efficient heat exchange between the second fluid and the first fluid. This leads to essentially an isothermal heat generating structure (e.g., chip) and also to the internal (within the heat management device or system) regeneration of the cooling capacity of the second fluid by the first fluid, with no need for routing the second fluid away from the heat generating structure for external chilling. Thus, embodiments of the present disclosure are more compact and simple and more reliable and less expensive than other solutions.

The second fluid may be a high performance coolant with superior thermophysical properties that are needed to remove heat from the hot spots. The second fluid can be a gas or liquid. In an embodiment, the second fluid is a liquid with superior thermophysical properties (e.g., water), a suspension of nanoparticles (known as the nanofluid), or a dielectric liquid (e.g., fluorocarbon such as FC-72) if direct contact between the second fluid and the heat generating structure (e.g., a chip surface) at the hot spot is needed to minimize the thermal contact resistance between the heat management device or system and the heat generating structure.

As mentioned above, the first fluid may be pumped through the global heat dissipater structure conduits (e.g., microchannels, pin fin array, or other enhanced surface microstructure) that is designed for handling the expected average (e.g., chip-level) heat fluxes based on the total power dissipation of the heat generating structure. It should be noted that the global heat dissipater structure (e.g., original baseline heat sink) does not have to be fundamentally re-designed or over-designed to handle extreme heat fluxes found in hot spots, as the second fluid essentially acts as an efficient fluidic heat spreader from the hot spot scale to the global scale. This translates to lower pressure drops for embodiments of the present disclosure and smaller and less powerful pumps and fans can be used.

As mentioned above, in an embodiment, the second fluid is pushed or pumped through a constricted cavity over a very short distance (e.g., 100 μm to 1 mm) covered by the hot spot, the pressure drop penalty is manageable as compared to a case when a large microchannel heat sink is being used over the entire chip area.

Figure 1B:
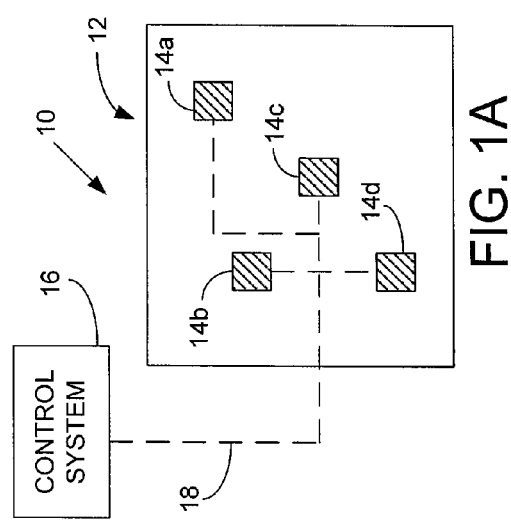
FIG. 1B illustrates a top view of the heat generating structure having a portion of the global heat dissipater structure conduits disposed thereon.
Figure 1C:
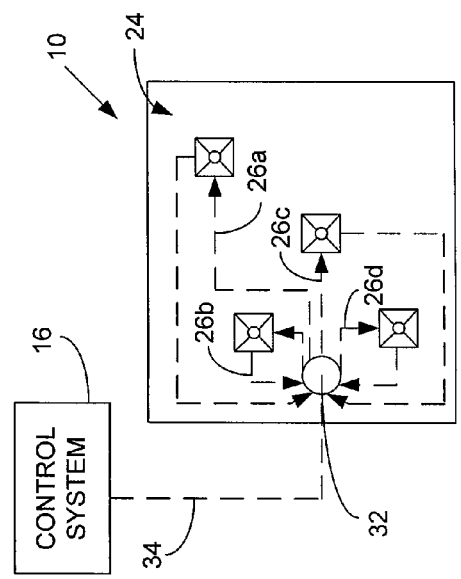
FIG. 1C illustrates a top view of a portion of a local heat dissipater structure.

FIG. 1A through 1C illustrate views of three levels of an embodiment of a heat management system 10. FIG. 1A illustrates a top view of a heat generating structure 12 having four hot spots 14a, 14b, 14c, and 14d. A control system 16 can be interfaced 18 with each of the hot spots 14a, 14b, 14c, and 14d. In particular, the control system 16 can be used to measure the temperature or heat flux at each of the hot spots 14a, 14b, 14c, and 14d using a thermocouple, heat flux gage, or other heat sensing device.

FIG. 1B illustrates a top view of the heat generating structure 12 having a portion of the global heat dissipater structure conduits 22 disposed thereon. The global heat dissipater structure conduits 22 direct a first fluid over the global heat dissipater structure to dissipate the heat generated by the heat generating structure 12.

FIG. 1C illustrates a top view of a portion of a local heat dissipater structure 24. The local heat dissipater structure 24 includes four local heat dissipater structure conduits 26a, 26b, 26c, and 26d to independently direct a second fluid to each of the hot spots 14a, 14b, 14c, and 14d. The control system 16 can be interfaced 34 with a second fluid control system 32 to independently direct flow of the second fluid to one or more of the local heat dissipater structure conduits 26*a*, 26*b*, 26*c*, and 26*d* (four structures are shown as an example, but the heat generating structure could include 1 or more). FIG. 1C illustrates that each of the local heat dissipater structure conduits 26*a*, 26*b*, 26*c*, and 26*d* has a closed loop configuration. It should be noted that each of the local heat dissipater structure conduits 26*a*, 26*b*, 26*c*, and 26*d* could flow into a single conduit after the second fluid flows past the hot spot. In addition, local heat dissipater structure conduits could be part of an open loop configuration.

Figure 2:
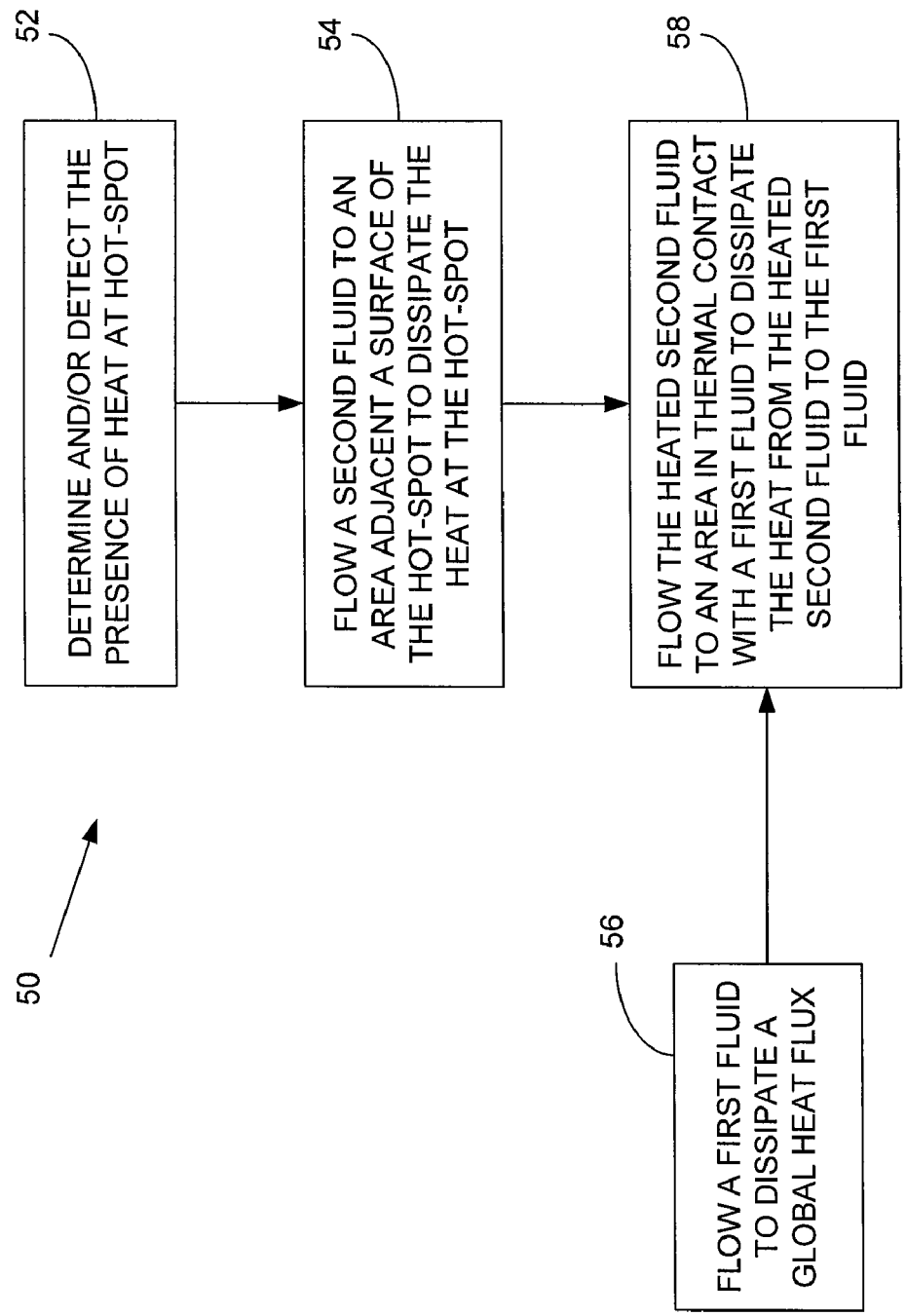
FIG. 2 is a flow chart describing a method of heat removal using embodiments of the present disclosure.

FIG. 2 is a flow chart describing a method 50 of heat removal using embodiments of the present disclosure. Block 52 states that an increased temperature or a heat flux at one or more hot spots has been detected or it has been previously determined that hot spots will be generated upon operation of the heat generating structure. The increase in temperature can be detected by a thermocouple or another temperature sensing device located in close proximity to the hot spot. In addition or in the alternative, the hot spots of the heat generating structure can be determined through previous experimentation or can be correlated with other measured activities (e.g., electrical, chemical, and others) of the heat generating structure. Thus, the location of the hot spots and conditions under which they have heat fluxes is known. Block 54 states that a second fluid is flowed to an area adjacent to (e.g., direct contact or indirect contact) a surface of the hot spot. The second fluid can be flowed to each of the hot spots independently of the other hot spots. Block 56 states that a first fluid dissipates a global heat flux in the heat generating structure. Block 58 states that the heated second fluid is flowed to an area in thermal contact with a first fluid to dissipate the heat from the heated second fluid to the first fluid. The first fluid and the second fluid are physically separated but are in thermal contact.

Figure 3:
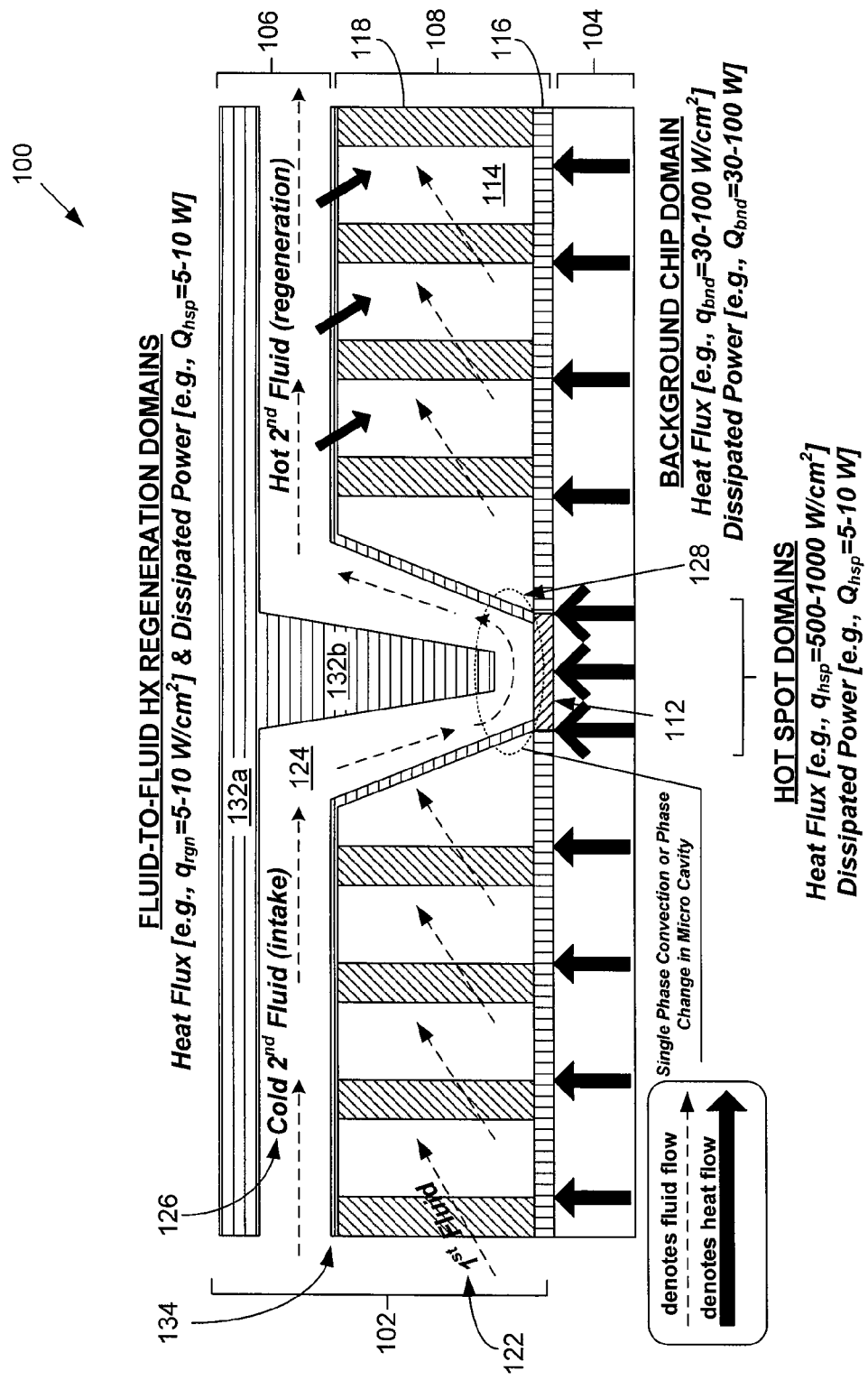
FIG. 3 illustrates an embodiment of a structure including a heat management device or system and a heat generating structure.

FIG. 3 illustrates an embodiment of a structure 100 including a heat management device or system 102 and a heat generating structure 104. The heat management device or system 102 includes a local heat dissipater structure 106 and a global heat dissipater structure 108.

The global heat dissipater structure 108 is disposed on the heat generating structure 104. It should be noted that the global heat dissipater structure 108 is not disposed on the entire surface of the heat generating structure 104. In particular, the global heat dissipater structure 108 is not disposed on the areas of the heat generating structure 104 that are or could be a hot spot 112 of the heat generating structure 104. In an embodiment, a portion of the global heat dissipater structure 108 could be disposed on the hot spot 112, but the portion functions as a contact area for the local heat dissipater structure 106 so that the local heat dissipater structure 106 can remove the heat from the hot spot 112.

As mentioned above, the heat generating structure 104 produces heat that can be dissipated by the heat management device or system 102. In particular, the heat from most of the heat generating structure 104 is thermally coupled to the global heat dissipater structure 108. The heat is thermally communicated to a first fluid 122 flowing through one or more global heat dissipater conduits 114 disposed within the global heat dissipater structure 108. The global heat dissipater conduits 114 are enclosed or substantially enclosed on one or more sides by the global conduit structures 116 and 118. In addition, the global heat dissipater conduits 114 are bound in one or more areas by the local heat dissipater structure 106. In another embodiment, the global heat dissipater conduits 114 are enclosed by the global heat dissipater structure 108, and are only in indirect contact (and thermal communication) with the local heat dissipater structure 106. The first fluid 122 flows through the global heat dissipater conduits 114. The flow rate of the first fluid 122 can be controlled by a control system (not shown) that functions to regulate the heat flux or temperature in the structure 100.

The local heat dissipater structure 106 is disposed on the global heat dissipater structure 108 and the heat generating structure 104. In particular, the local heat dissipater structure 106 is disposed on the heat generating structure 104 at each area that is or could be a hot spot 112 of the heat generating structure 104. In an embodiment, the local heat dissipater structure 106 is disposed on a portion of the global heat dissipater structure 108 disposed on the hot spot 112. In this embodiment, the portion of the global heat dissipater structure 108 functions as a contact area for the local heat dissipater structure 106 so that the local heat dissipater structure 106 can remove heat from the hot spot 112.

The local heat dissipater structure 106 includes a local heat dissipater conduit 124 for flowing a second fluid 126. The local heat dissipater conduit 124 is enclosed by the local conduit structures 132*a*, 132*b*, and 134. The local conduit structure 132*b* directs the local heat dissipater conduit 124 so the second fluid 126 flows adjacent the area of the hot spot 112. In this regard, the second fluid 126 flows through to a constricted area 128 in a location of the local heat dissipater conduit 124 that is adjacent the hot spot 112. The local heat dissipater conduit 124 is configured to flow the second fluid 126 through the constricted area 128 to dissipate heat via forced convection with or without phase change at the hot spot 112.

The second fluid 126 increases its temperature or changes its phase (boil/evaporate) fully or partially from liquid to vapor as it flows past the hot spot 112 and assumes heat dissipated at the hot spot 112. Subsequently, the heated second fluid 126 flows through the local heat dissipater conduit 124 that is in thermal contact with the first fluid 122 flowing through the global heat dissipater conduit 114. The first fluid 122 dissipates heat from the second fluid 126, thus cooling down the second fluid 126 resulting in a decrease of its temperature or change of its phase (condensation) fully or partially from vapor to liquid. The local conduit structures 132*a* and 132*b* are designed to guide the second fluid 126. As shown in FIG. 3, the local conduit structures 132*a*, 132*b*, and 134 form the local heat dissipater conduit 124 so that the second fluid flows on top of the global heat dissipater conduits 114 until in close proximity to the hot spot 112. Then, the local conduit structure 132*b* directs the second fluid 126 toward the hot spot 112. As depicted in FIG. 3, local conduit structure 132*b* directs the second fluid 126 down towards the hot spot 112, and then back up so that the second fluid 126 can be in thermal communication with the first fluid 122. The dimensions of the constricted area 128 are such that the constricted area 128 produces a sufficiently large convective heat transfer coefficient and has enough surface area for the second fluid 126 to remove heat from the hot spot 112 when the second fluid 126 has an appropriate flow rate. The dimensions of the constricted area 128 depend upon the area of the hot spot 112, hot spot temperature and the heat flux that needs to be dissipated, thermophysical properties of the second fluid 126, the flow rate of the second fluid, and the like. The flow rate of the second fluid 126 can be controlled by a control system (not shown) that functions to regulate the temperature or heat flux dissipated in the structure 100.

It should be noted that the relative position of the local heat dissipater conduit 124 and the global heat dissipater conduits 114 can be altered as long as the functions of each remain substantially the same. For example, the second fluid 126 in the local heat dissipater conduit 124 should be used to remove heat from the hot spot 112, and then the first fluid 122 in the global heat dissipater conduits 114 should dissipate the heat from the second fluid 126. In an embodiment, the local heat dissipater conduit 124 is disposed within (e.g., through the middle) the global heat dissipater conduits 114 so that heat can be dissipated on all surfaces of the local heat dissipater conduit 124 rather than just the bottom surface of the local heat dissipater conduit 124, as shown in FIG. 3.

Figure 4:
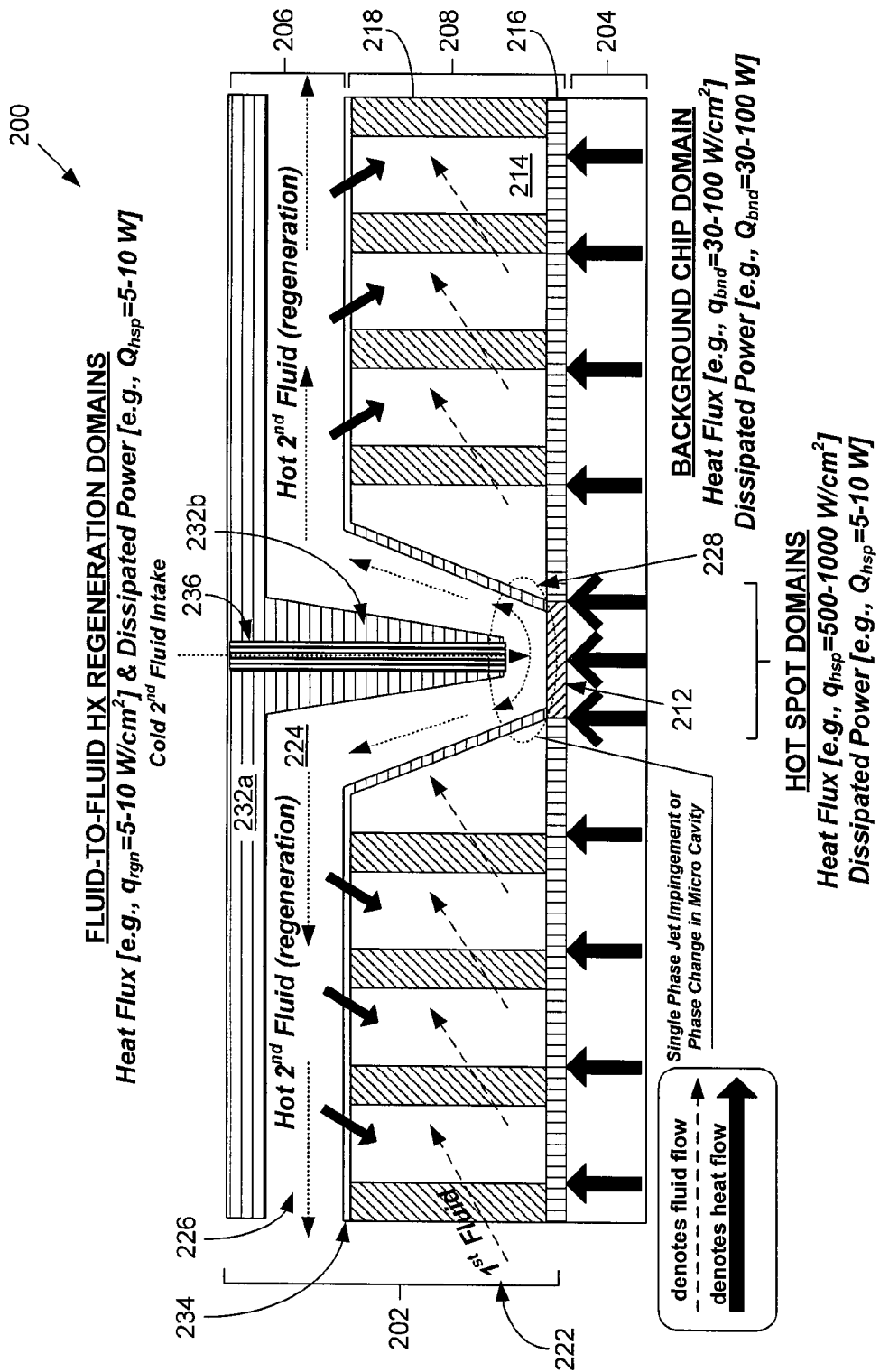
FIG. 4 illustrates an embodiment of the structure including a heat management device or system and a heat generating structure.

FIG. 4 illustrates an embodiment of the structure 200 including a heat management device or system 202 and a heat generating structure 204. The heat management device or system 202 includes a local heat dissipater structure 206 and a global heat dissipater structure 208.

The global heat dissipater structure 208 is disposed on the heat generating structure 204. It should be noted that the global heat dissipater structure 208 is not disposed on the entire surface of the heat generating structure 204. In particular, the global heat dissipater structure 208 is not disposed on the areas of the heat generating structure 204 that are or could be a hot spot 212 of the heat generating structure 204. The local heat dissipater structure 206 can remove the heat from the hot spot 212. In an embodiment, a portion of the global heat dissipater structure 208 could be disposed on the hot spot 212, but the portion functions as a contact area for the local heat dissipater structure 206 so that the second fluid 226 can be regenerated by rejecting heat to the first fluid 222.

As mentioned above, the heat generating structure 204 produces heat that can be dissipated by the heat management device or system 202. In particular, the heat from most of the heat generating structure 204 is thermally coupled to the global heat dissipater structure 208. The heat is thermally communicated to a first fluid 222 flowing through one or more global heat dissipater conduits 214 disposed within the global heat dissipater structure 208. The global heat dissipater conduits 214 are enclosed or substantially enclosed on one or more sides by the global conduit structures 216 and 218. In addition, the global heat dissipater conduits 214 are bound in one or more areas by the local heat dissipater structure 206. In another embodiment, the global heat dissipater conduits 214 are enclosed by the global heat dissipater structure 208, and are only in indirect contact (and thermal communication) with the local heat dissipater structure 206. The first fluid 222 flows through the global heat dissipater conduits 214. The flow rate of the first fluid 222 can be controlled by a control system (not shown) that functions to regulate the heat flux in the structure 200.

The local heat dissipater structure 206 is disposed on the global heat dissipater structure 208 and the heat generating structure 204. In particular, the local heat dissipater structure 206 is disposed on the heat generating structure 204 at each area that is or could be a hot spot 212 of the heat generating structure 204. In an embodiment, the local heat dissipater structure 206 is disposed on a portion of the global heat dissipater structure 208 disposed on the hot spot 212. In this embodiment, the portion of the global heat dissipater structure 208 functions as a contact area for the local heat dissipater structure 206 so that the local heat dissipater structure 206 can remove the heat from the hot spot 212.

The local heat dissipater structure 206 includes a local heat dissipater conduit 224, which provides a conduit for flowing a second fluid 226. The local heat dissipater conduit 224 is enclosed by the local conduit structures 232a, 232b, and 234. The local conduit structure 232b includes a jet-structure 236 configured to produce a microjet or multiple microjets or a spray of the second fluid 226 that impinges upon the hot spot 212 to dissipate heat at the hot spot 212. The configuration and dimensions of the jet-structure 236 and the local heat dissipater conduit 224 are such that the second fluid 226 is able to produce sufficiently high convective heat transfer coefficient to efficiently remove heat from the hot spot 212. The configuration and dimensions of the jet-structure 236 and the local heat dissipater conduit 224 depend upon the area of the hot spot 212, the heat flux that needs to be dissipated, the type of the second fluid 226, the flow rate of the second fluid being jetted/sprayed, and the like. The flow rate of the jetted/sprayed second fluid 226 can be controlled by a control system (not shown) that functions to regulate the heat flux that needs to be removed from the hot spot 212. A microjet can be a single jet or multiple jets of a second fluid 226 generated by a single nozzle or an array of nozzles jet-structure 236) covering an entire or partial area of the hot spot 212. A microjet could be homogeneous and submerged or a gas jet carrying droplets of the second fluids towards the hot spot. The function of the jet-structure 236 is to generate the very high convective heat transfer coefficient of the impinging flow, with or without phase change (i.e. the second fluid evaporation), to dissipate very high heat fluxes at the hot spot.

Once the second fluid 226 is jetted out of the jet-structure 236, the local heat dissipater structure 206 directs the heated second fluid 226 away from the area of the hot spot 212. Subsequently, the heated second fluid 226 flows through the local heat dissipater conduit 224 that is in thermal contact with the first fluid 222 flowing through the global heat dissipater conduit 214. The first fluid 222 dissipates the heat from the second fluid 226 thus cooling down (regenerating) the second fluid 226. The local conduit structures 232a and 232b are designed to guide the second fluid 226. As shown in FIG. 4, the local conduit structures 232a, 232b, and 234 form the local heat dissipater conduit 224 so that the heated second fluid 226 flows from the hot spot away to be adjacent the global heat dissipater conduits 214.

It should be noted that the shape, structure, and relative position of the local heat dissipater conduit 224 and the global heat dissipater conduits 214 can be altered as long as the functions of each remain substantially the same. For example, the second fluid 226 in the local heat dissipater conduit 224 should be used to remove heat from the hot spot 212, and then the first fluid 222 in the global heat dissipater conduits 214 should dissipate the heat from the second fluid 226. In an embodiment, the local heat dissipater conduit 224 is disposed within the global heat dissipater conduits 214 so that heat can be dissipated on all surfaces of the local heat dissipater conduit 224 rather than just the bottom surface of the local heat dissipater conduit 224, as shown in FIG. 4.

In a specific embodiment, experiments have been conducted with a thermal management device designed and built according to the schematic in FIG. 4. Specifically, a commercially available pin fin array heat sink was used as the global heat dissipater structure and the local heat dissipater structure was built in copper and integrated with the global heat dissipater structure to form the heat management device or system. The heat generating structure was simulated by an array of cartridge heaters embedded into a planar copper block, and the hot spot was simulated by a "hot" copper finger 1 mm in diameter, inserted in the middle of the copper bock. Air was used as a first fluid for cooling the global heat dissipater structure and was pumped by a fan blower, and water, a second fluid for cooling the hot spot, was pumped by a conventional micropump. Through numerous, repeated experiments, it was demonstrated that the device was capable of removing the global heat flux of 14 W/cm$^2$, and the local heat flux from the hot spot of 450 W/cm$^2$ with complete regeneration of the second fluid by the first fluid. Further, the experiments showed that upon activation of the flow of the second fluid, the temperature non-uniformity on the surface of the heat generating structure was reduced from 14° C. to less than 1° C.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include ±10%, or more of the numerical value(s) being modified. In addition, the phrase "about 'x' to 'y'" includes "about 'x' to about 'y'".

Many variations and modifications may be made to the above-described embodiments. All such modifications and variations are intended to be included herein within the scope of this disclosure and protected by the following claims.

Therefore, the following is claimed:

1. A heat management device, comprising:
   a global heat dissipater structure disposed on a portion of a heat generating structure, wherein the heat from the heat generating structure heats the global heat dissipater structure, and wherein the global heat dissipater structure includes global heat dissipater conduits;
   a first fluid directed to circulate in the global heat dissipater conduit to dissipate heat from the heat generating structure;
   a local heat dissipater structure disposed in thermal communication with the global heat dissipater and with at least one hot spot of the heat generating structure, wherein the local heat dissipater structure includes local heat dissipater conduits that are adjacent at least one hot spot and the global heat dissipater conduits, wherein the local heat dissipater conduit includes a first constricted cavity in a location of the local heat dissipater conduit that is adjacent a first hot spot, wherein the local heat dissipater conduit is configured to flow the second fluid through the first constricted cavity to dissipate heat at the hot spot, and wherein a portion of the first constricted cavity is defined by a wall adjacent at least one hot spot, wherein the local heat dissipater conduit that includes a first let-structure configured to produce at least one microjet or spray of the second fluid that impinges upon a first hot spot to remove heat at the hot spot wherein the local heat dissipater conduit is configured to flow the second fluid through the local heat dissipater conduit after impinging upon the hot spot, wherein the first jet-structure and the first constricted cavity are different, but adjacent areas of the heat management device such that the second fluid flows from the first let-structure to the first constricted cavity to dissipate heat from the hot spot; and
   a second fluid directed to circulate in the local heat dissipater conduit to dissipate heat from at least one hot spot, wherein the heat of the second fluid is dissipated to the first fluid in the global heat dissipater conduits, and wherein the first fluid and the second fluid are not mixed with one another.

2. The heat management device of claim 1, wherein the ratio of cross-sections of the local heat dissipater conduit and the first constricted cavity is about 1 to 10,000.

3. The heat management device of claim 1, wherein the local heat dissipater structure includes a nozzle for the first jet-structure.

4. The heat management device of claim 1, wherein the first fluid is selected from: air, water, a refrigerant, or a dielectric fluid, and wherein the second fluid is selected from: air, water, a refrigerant, a dielectric fluid, or a suspension of nanoparticles.

5. The heat management device of claim 4, wherein the first fluid and the second fluid are different fluids.

6. The heat management device of claim 1, wherein the first fluid is air and the second fluid is water.

7. The heat management device of claim 1, wherein the heat generating structure is a computer chip.

8. The heat management device of claim 1, further comprising:
   a second global heat dissipater structure disposed on a portion of the heat generating structure, wherein the heat from the heat generating structure heats the second global heat dissipater structure, and wherein the second global heat dissipater structure includes global heat dissipater conduits;
   a third fluid directed to circulate in the second global heat dissipater conduit to dissipate heat from the heat generating structure;
   a second local heat dissipater structure disposed in thermal communication with the second global heat dissipater and with at least one hot spot of the heat generating structure, wherein the second local heat dissipater structure includes second local heat dissipater conduits that are adjacent at least one hot spot and the second global heat dissipater conduits; and
   a fourth fluid directed to circulate in the second local heat dissipater conduit to dissipate heat from at least one hot spot, wherein the heat of the fourth fluid is dissipated to the third fluid in the second global heat dissipater conduits, and wherein the third fluid and the fourth fluid are not mixed with one another,
   wherein the third fluid is selected from: air, water, a refrigerant, or a dielectric fluid, and wherein the fourth fluid is selected from: air, water, a refrigerant, a dielectric fluid, or a suspension of nanoparticles.

9. The heat management device of claim 1, further comprising a plurality of local heat dissipater structures, wherein the heat generating structure includes a plurality of hot spots, and wherein one of the local heat dissipater structures interacts with one of the hot spots so that each local heat dissipater structure only dissipates heat from one hot spot.

10. The heat management device of claim 1, wherein the local heat dissipater structure is activated on-demand for hot spot heat dissipation.

11. The heat management device of claim 1, wherein the global heat dissipater structure comprises fins or an array of fins.

12. The heat management device of claim 1, wherein the local heat dissipater structure comprises microfins adjacent to the hot spot.

13. The heat management device of claim 1, wherein the second fluid dissipates heat at the hot spot via phase change heat transfer.

14. The heat management device of claim 1, wherein first fluid dissipates heat via phase change heat transfer.

15. The heat management device of claim 1, wherein local heat dissipater conduits are a closed-loop system.

16. A heat management system, comprising:

a heat generating structure that includes at least one hot spot;

a global heat dissipater structure disposed on a portion of the heat generating structure, wherein the heat from the heat generating structure heats the global heat dissipater structure, and wherein the global heat dissipater structure includes global heat dissipater conduits;

a first fluid directed to circulate in the global heat dissipater conduit to dissipate heat from the heat generating structure;

a first fluid pump to circulate the first fluid through the global heat dissipater conduit;

a local heat dissipater structure disposed in thermal communication with the global heat dissipater and with at least one hot spot of the heat generating structure, wherein the local heat dissipater structure includes local heat dissipater conduits that are adjacent at least one hot spot and the global heat dissipater conduits, wherein the local heat dissipater conduit includes a first constricted cavity in a location of the local heat dissipater conduit that is adjacent a first hot spot, wherein the local heat dissipater conduit is configured to flow the second fluid through the first constricted cavity to dissipate heat at the hot spot, and wherein a portion of the first constricted cavity is defined by a wall adjacent at least one hot spot, wherein the local heat dissipater conduit that includes a first let-structure configured to produce at least one microjet or spray of the second fluid that impinges upon a first hot spot to remove heat at the hot spot, wherein the local heat dissipater conduit is configured to flow the second fluid through the local heat dissipater conduit after impinging upon the hot spot, wherein the first jet-structure and the first constricted cavity are different, but adjacent areas of the heat management device such that the second fluid flows from the first jet-structure to the first constricted cavity to dissipate heat from the hot spot;

a second fluid directed to circulate in the local heat dissipater conduit to dissipate heat from at least one hot spot, wherein the heat of the second fluid is dissipated to the first fluid in the global heat dissipater conduits, and wherein the first fluid and the second fluid are not mixed with one another; and a second fluid pump to circulate the second fluid through the local heat dissipater conduit.

17. A method of dissipating heat in a heat generating structure:

circulating a first fluid adjacent a portion of the heat generating structure;

dissipating heat from a portion of the heat generating structure to the first fluid;

circulating a second fluid adjacent at least one hot spot on the heat generating structure through a local heat dissipater conduit includes a first constricted cavity in a location of the local heat dissipater conduit that is adjacent a first hot spot, and wherein a portion of the first constricted cavity is defined by a wall adjacent at least one hot spot;

dissipating heat from at least one hot spot on the heat generating structure to the second fluid, wherein dissipating includes flowing the second fluid through the local heat dissipater conduit that includes a first let-structure, wherein the first jet-structure produces at least one microjet or spray of the second fluid that impinges upon a first hot spot, wherein the second fluid removes heat at the hot spot, wherein flowing the second fluid through the local heat dissipater conduit through the local heat dissipater conduit after impinging upon the hot spot, wherein the first jet-structure and the first constricted cavity are different, but adjacent areas of the heat management device such that the second fluid flows from the first jet-structure to the first constricted cavity to dissipate heat from the hot spot; and circulating the second fluid adjacent the first fluid to dissipate heat from the second fluid to the first fluid.

18. The method of claim 17, wherein the heat generating structure is a computer chip.

19. The method of claim 17, wherein the first fluid is air and the second fluid is water.

20. The heat management device of claim 1, wherein the first fluid is air and the second fluid is water.

21. The heat management system of claim 16, wherein the first fluid is air and the second fluid is water.

* * * * *

UNITED STATES PATENT AND TRADEMARK OFFICE
CERTIFICATE OF CORRECTION

| | | |
|---|---|---|
| PATENT NO. | : 8,082,978 B2 | Page 1 of 1 |
| APPLICATION NO. | : 11/874971 | |
| DATED | : December 27, 2011 | |
| INVENTOR(S) | : Fedorov | |

It is certified that error appears in the above-identified patent and that said Letters Patent is hereby corrected as shown below:

IN THE CLAIMS:

Column 16, line 19, claim 17, the word "let-" should be "jet-"

Signed and Sealed this
Thirteenth Day of March, 2012

David J. Kappos
*Director of the United States Patent and Trademark Office*